United States Patent
He et al.

(10) Patent No.: US 9,614,189 B2
(45) Date of Patent: Apr. 4, 2017

(54) ORGANIC ELECTROLUMINISCENT DISPLAY AND METHOD FOR PREPARING THE SAME, AND DISPLAY DEVICE

(71) Applicant: BOE TECHNOLOGY GROUP CO., LTD., Beijing (CN)

(72) Inventors: Xuan He, Beijing (CN); Long Wang, Beijing (CN); Qinghui Zeng, Beijing (CN); Fei Liu, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/429,763

(22) PCT Filed: May 20, 2014

(86) PCT No.: PCT/CN2014/077887
§ 371 (c)(1),
(2) Date: Mar. 26, 2015

(87) PCT Pub. No.: WO2015/085713
PCT Pub. Date: Jun. 18, 2015

(65) Prior Publication Data
US 2016/0028045 A1    Jan. 28, 2016

(30) Foreign Application Priority Data
Dec. 10, 2013  (CN) .......................... 2013 1 0674028

(51) Int. Cl.
*H01L 51/52*  (2006.01)
*H01L 27/32*  (2006.01)
(Continued)

(52) U.S. Cl.
CPC ...... *H01L 51/5281* (2013.01); *H01L 27/3244* (2013.01); *H01L 51/524* (2013.01);
(Continued)

(58) Field of Classification Search
CPC ............. H01L 51/5281; H01L 27/3244; H01L 51/524; H01L 51/5253
See application file for complete search history.

(56) References Cited

U.S. PATENT DOCUMENTS

2005/0194896 A1*  9/2005  Sugita .................... B82Y 20/00
                                                           313/506
2009/0322214 A1   12/2009  Lee et al.
(Continued)

FOREIGN PATENT DOCUMENTS

CN     1627876 A     6/2005
CN     1665361 A     9/2005
(Continued)

OTHER PUBLICATIONS

International Search Report and Written Opinion in International Application No. PCT/CN2014/077887, dated Sep. 11, 2014.
(Continued)

*Primary Examiner* — Jaehwan Oh
(74) *Attorney, Agent, or Firm* — BakerHostetler LLP

(57) ABSTRACT

Disclosed are an organic electroluminescent display and a method for preparing the same, and a display device. The organic electroluminescent display comprises: a base substrate; an organic electroluminescent pixel array, which is set on the base substrate; a packaging coverplate or a packaging film, which is covered outside the organic electroluminescent pixel array; and a phase difference film and a polarization functional film located inside the packaging coverplate or the packaging film and attached to the organic electroluminescent pixel array in turn. In the organic electroluminescent display according to the invention, the unnecessary films, such as a TAC films that need to be attached to the two sides of a polarization functional film in an existing circular sheet polarizer and a binding agent layer, etc., can be omitted, thereby the transmittance of a display can be
(Continued)

improved, and the contrast of a display can be increased; moreover, the overall thickness of a display may be reduced, and the problem of being difficult to roll up may be avoided; and there exists no interference of oxygen and aqueous vapor, thus the durability of the circular sheet polarizer can be increased.

10 Claims, 3 Drawing Sheets

(51) Int. Cl.
    *H01L 51/56*     (2006.01)
    *H01L 51/00*     (2006.01)

(52) U.S. Cl.
    CPC ...... *H01L 51/5246* (2013.01); *H01L 51/5253* (2013.01); *H01L 51/5262* (2013.01); *H01L 51/56* (2013.01); *H01L 51/004* (2013.01); *H01L 51/0035* (2013.01); *H01L 51/0048* (2013.01); *H01L 2227/323* (2013.01); *H01L 2251/5338* (2013.01); *H01L 2251/558* (2013.01)

(56) References Cited

U.S. PATENT DOCUMENTS

| | | | | |
|---|---|---|---|---|
| 2012/0056211 | A1* | 3/2012 | Kitagawa | B29C 55/026 257/88 |
| 2012/0113356 | A1* | 5/2012 | Yu | G02B 5/305 349/62 |
| 2012/0253061 | A1* | 10/2012 | Takahashi | G02B 27/26 560/158 |
| 2013/0140587 | A1* | 6/2013 | Lim | H01L 51/5281 257/88 |
| 2013/0193832 | A1* | 8/2013 | Jung | G02B 5/3083 313/112 |
| 2014/0063369 | A1* | 3/2014 | Hosorogiya | G02F 1/13338 349/12 |
| 2014/0071353 | A1* | 3/2014 | Nashiki | G02F 1/13338 349/12 |
| 2014/0118665 | A1* | 5/2014 | Miyazaki | G02F 1/133536 349/96 |
| 2014/0332786 | A1 | 11/2014 | Nakazawa | |
| 2016/0025912 | A1* | 1/2016 | Zeng | G02B 5/3083 359/489.01 |

FOREIGN PATENT DOCUMENTS

| | | |
|---|---|---|
| CN | 1988206 A | 6/2007 |
| CN | 102832352 A | 12/2012 |
| CN | 102916034 A | 2/2013 |
| CN | 103682157 A | 3/2014 |
| WO | 2013/077220 A1 | 5/2013 |

OTHER PUBLICATIONS

Office Action in Chinese Patent Application No. 201310674028.9, dated Jul. 1, 2015.

Office Action in Chinese Patent Application No. 201310674028.9, dated Dec. 21, 2015.

\* cited by examiner

ORGANIC ELECTROLUMINISCENT DISPLAY AND METHOD FOR PREPARING THE SAME, AND DISPLAY DEVICE

CROSS-REFERENCE TO RELATED APPLICATIONS

The present application is the U.S. National Phase of International Patent Application No. PCT/CN2014/077887, filed May 20, 2014 and claims priority to Chinese Patent Application No. 201310674028.9, filed Dec. 10, 2013, the disclosures of which are incorporated herein by reference in their entirety.

FIELD OF THE INVENTION

The present invention relates to the field of display technologies, and in particular, to an organic electroluminescent display and a method for preparing the same, and a display device comprising the organic electroluminescent display.

DESCRIPTION OF THE PRIOR ART

At present, in comparison with a traditional liquid crystal display (LCD), an organic electroluminescent display (OLED) has gradually become a main stream of the display field due to its features of fast response, wide color gamut, ultrathinness and flexibility, etc.

The structure of an OLED display mainly includes: a base substrate; and an organic electroluminescent pixel array formed on the base substrate, wherein, each organic electroluminescent pixel array comprises: an anode and a cathode that are set oppositely; and a luminescent layer located between the anode and the cathode. The luminescence of an OLED display is realized by exciting an organic material in a luminescent layer to emit light when the electrons in the cathode and the holes in the anode recombine in the luminescent layer. In an OLED display, the organic material functioning as the luminescent layer and the active metal functioning as the cathode are both very sensitive to aqueous vapor and oxygen gas, thus an OLED display requires a support of a packaging technology with higher tightness than other displays. If an OLED display is not packaged tightly, aqueous vapor and oxygen gas will permeate inside the display from the ambient environment, so that oxidation of the cathode metal and deterioration of the organic material of the luminescent layer will be caused, thus the lifetime of the OLED display will be shortened, or a fatal damage of the device will be directly caused, which influences the usage thereof.

At present, in medium and small-sized OLED displays, a glass coverplate is mainly employed for packaging; however, for flexible or large-sized OLED displays, film packaging is mainly employed for the OLED displays in the existing methods. In addition, in order to lower the ambient light reflected by an OLED display, which will lower the contrast and visibility of the display, a layer of circular sheet polarizer further needs to be attached to the outside of OLED display after packaging.

FIG. 1 shows a structural representation of an existing circular sheet polarizer. As shown in FIG. 1, a circular sheet polarizer is jointly consisted of a layer of polyvinyl alcohol (PVA) 12 sandwiched in two layers of cellulose triacetate (TAC) films 11 as well as a layer of quarter-wavelength plate 13. The circular sheet polarizer changes the polarized state of an incident light to make it unable to emerge, thus the contrast can be improved. It is the PVA layer 12 that functions to polarize. However, since a PVA material is prone to be hydrolyzed, in order to protect the PVA layer 12, a layer of TAC film 11 with a certain mechanical strength needs to be attached to the two sides of the PVA layer 12 for protection. Moreover, in order to attach the PVA layer 12 and the quarter-wavelength plate 13 together, a binding agent layer 14 needs to be added therebetween; and in order to attach the circular sheet polarizer onto a display, a binding agent layer 14 and a release film 15 need to be attached to the other side of the quarter-wavelength plate 13. Again, in order to avoid scratching, a protection layer 16 further needs to be attached to the outmost side of the circular sheet polarizer. Thus, it may be seen that, for the existing circular sheet polarizer, the structure is complex, the number of films is large, the thickness of the films is large, which is generally above 200 μm, and the manufacturing process is complex.

It may be know from above that, the structure of a circular sheet polarizer that needs to be attached to an OLED display is relatively complex and the film thickness is large; this will cause a problem of low transmittance and the like of the OLED display, and this will further cause a problem that the thickness of a flexible device is large and thus it is difficult to be rolled up.

SUMMARY OF THE INVENTION

In view of this, the present invention provides an organic electroluminescent display and a method for preparing the same, and a display device comprising the organic electroluminescent display, thereby solving the problem that, for an existing organic electroluminescent display to which a circular sheet polarizer is attached, the transmittance is low, the film thickness is large and it is difficult to be rolled up, etc.

According to an embodiment of the invention, there provides an organic electroluminescent display, which comprises: a base substrate; an organic electroluminescent pixel array, which is set on the base substrate; and a packaging coverplate or a packaging film, which covers the organic electroluminescent pixel array;

wherein, the organic electroluminescent display further comprises: a phase difference film and a polarization functional film, which are located inside the packaging coverplate or the packaging film and attached to the organic electroluminescent pixel array in turn.

In one embodiment of the invention, the organic electroluminescent display further comprises: a protection layer, which is located between the organic electroluminescent pixel array and the phase difference film and covers a surface of the organic electroluminescent pixel array.

In one embodiment of the invention, the organic electroluminescent display further comprises: a filling layer, which is located between the polarization functional film and the packaging coverplate, for isolating water and oxygen, supporting the cell thickness and coping with the change in an external stress.

In one embodiment of the invention, the phase difference film in the organic electroluminescent display is a quarter-wavelength phase difference film.

In one embodiment of the invention, the material of the phase difference film in the organic electroluminescent display is a mixture of polyvinyl chloride and polymethyl methacrylate, a mixture of polystyrene and polypropylene or a mixture of polycarbonate resins.

In one embodiment of the invention, the material of the polarization functional film in the organic electroluminescent display is polyvinyl alcohol or carbon nano-tube.

According to an embodiment of the invention, there provides a method for preparing the above organic electroluminescent display, which comprises the following steps performed in a vacuum, or in an environment protected by inert gas or nitrogen gas:

forming an organic electroluminescent pixel array on a base substrate;

attaching a phase difference film and a polarization functional film in turn on the organic electroluminescent pixel array; and packaging the organic electroluminescent pixel array attached with the phase difference film and the polarization functional film In one embodiment of the method for preparing the organic electroluminescent display according to the invention, the phase difference film is attached to the organic electroluminescent pixel array in roll mode.

In one embodiment of the method for preparing the organic electroluminescent display according to the invention, the polarization functional film is attached in roll mode to the organic electroluminescent pixel array attached with the phase difference film.

According to an embodiment of the invention, there provides a display device, which comprises the above organic electroluminescent display.

DETAILED DESCRIPTION OF THE PREFERRED EMBODIMENTS

Figure 1:
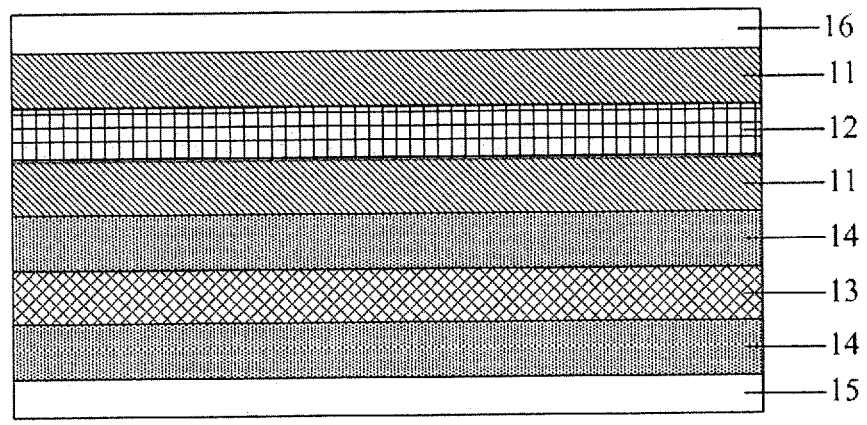
FIG. 1 is a structural representation of an existing circular sheet polarizer.

The specific implementation of an organic electroluminescent display and a method for preparing the same, and a display device according to the embodiments of the invention will be illustrated in detail below in conjunction with the drawings.

The thickness and shape of each film in the drawings do not reflect the real scale; instead, the object thereof is only to schematically illustrate the contents of the invention.

Figure 2A:
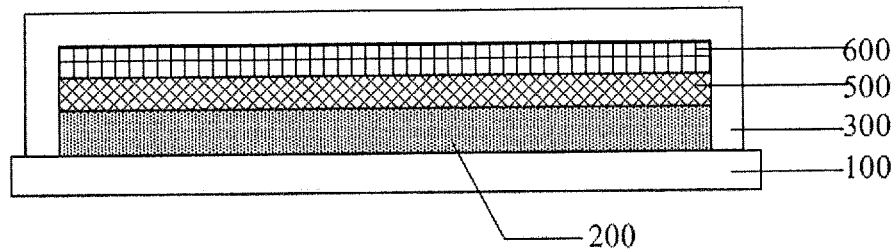
FIG. 2a to FIG. 2c are respectively structural representations of an organic electroluminescent display according to one embodiment of the invention.
Figure 2B:
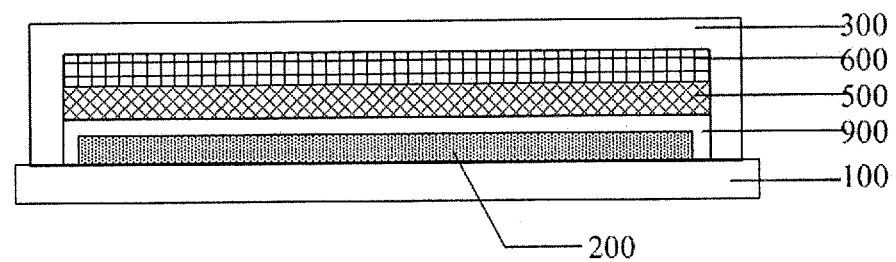
Figure 2C:
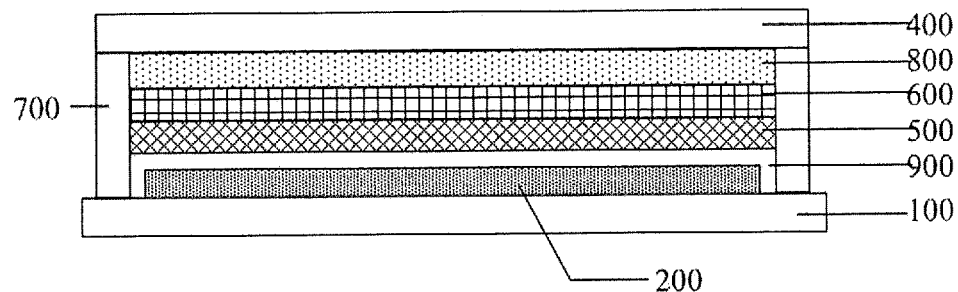

FIG. 2a-FIG. 2c respectively show an organic electroluminescent display according to one embodiment of the invention. As shown in FIG. 2a-FIG. 2c, the organic electroluminescent display includes: a base substrate 100; an organic electroluminescent pixel array 200, which is set on the base substrate 100; a packaging coverplate 400 or a packaging film 300, which covers an outside of the organic electroluminescent pixel array 200. The organic electroluminescent display further includes: a phase difference film 500 and a polarization functional film 600, which are located inside the packaging coverplate 400 or the packaging film 300 and attached to the organic electroluminescent pixel array 200 in turn.

In one embodiment of the organic electroluminescent display according to the invention, the organic electroluminescent pixel array 200 may include: a plurality of organic electroluminescent structures, each of which is consisted of an anode, a cathode and a luminescent layer located between the anode and the cathode; and a thin film transistor, which is configured for controlling each of the organic electroluminescent structure. Specifically, the organic electroluminescent pixel array 200 may have any specific structure of the prior art, and it will not be described again here.

In one embodiment of the organic electroluminescent display according to the invention, the phase difference film 500 and the polarization functional film 600 are the main components that construct the circular sheet polarizer, and the phase difference film 500 and the polarization functional film 600 work jointly to prevent a reflected light from passing through.

Specifically, the main function of the polarization functional film 600 is to convert a natural light passing through into a linearly-polarized light. The material for manufacturing the polarization functional film 600 may be polyvinyl alcohol or carbon nano-tube. By attaching the polarization functional film 600 in a vacuum, or in an environment protected by inert gas or nitrogen gas, the possibility of hydrolyzation in an aqueous vapor environment may be lowered, and the durability and homogeneity thereof may be improved.

In one embodiment of the invention, the phase difference film 500 may be a quarter-wavelength phase difference film, and the main function thereof is to change a linearly-polarized light passing through into a circularly-polarized light or to change a circularly-polarized light passing through into a linearly-polarized light. The material of the phase difference film may be a mixture of polyvinyl chloride and polymethyl methacrylate, a mixture of polystyrene and polypropylene or a mixture of polycarbonate resins, etc. In one embodiment of the invention, the thickness of the phase difference film is generally controlled in a range of 100 nm to 100 μm.

Therefore, the phase difference film 500 needs to be located on one side of the polarization functional film 600 that is adjacent to the organic electroluminescent pixel array 200, that is, the polarization functional film 600 is more adjacent to the outside ambient light than the phase difference film 500. Thus, after the natural light enters from the polarization functional film 600, it becomes a linearly-polarized light after passing through the polarization functional film 600, and then the linearly-polarized light becomes a laevogyrate circularly-polarized light after passing through the phase difference film 500. After the laevogyrate circularly-polarized light is reflected back by the organic electroluminescent pixel array 200, it becomes a dextrogyrate circularly-polarized light; and after passing through the first phase difference film 500 again, it becomes from a dextrogyrate circularly-polarized light into a linearly-polarized light. The linearly-polarized light at this time is perpendicular to the previous linearly-polarized light, and it cannot pass through a linear sheet polarizer. Thereby, the reflected light cannot transmit through the polarization functional film 600, so that the influence of the ambient light may be reduced, and the contrast may be improved.

The above organic electroluminescent display according to the embodiment of the invention may be adapted to flexible or large-sized OLED displays. At this time, the organic electroluminescent pixel array 200 is generally packaged in film packaging mode. That is, as shown in FIG. 2a, a layer of packaging film 300 covers by means of a chemical vapor deposition an outside of an organic electroluminescent pixel array 200 attached with a phase difference film 500 and a polarization functional film 600, wherein the packaging film 300 may have a waterproof and oxygenproof protection function.

The above organic electroluminescent display according to the embodiment of the invention may also be adapted to medium and small-sized OLED displays. At this time, the organic electroluminescent pixel array 200 is generally packaged in packaging coverplate mode. That is, as shown in FIG. 2c, a layer of packaging coverplate 400 covers by means of a sealant an outside of an organic electroluminescent pixel array 200 attached with a phase difference film 500 and a polarization functional film 600, wherein the packaging coverplate 400 may have a waterproof and oxygenproof protection function.

Moreover, in order to further prevent the external aqueous vapor from intruding the OLED display, as shown in FIG. 2c, a filling layer 800 is usually set independently inside the packaging coverplate 400, i.e., between the packaging coverplate 400 and the polarization functional film 600, thereby isolating water and oxygen, supporting the cell thickness and coping with the change of external stress. The material of the filling layer 800 may be epoxy resin, which functions to isolate water and oxygen gas, does not contain water or other volatile byproducts, and has a small contractility during UV curing so as to effectively support the cell thickness.

Moreover, in order to reinforce the waterproof and oxygenproof performance of an OLED display, after manufacturing an organic electroluminescent pixel array 200 on a base substrate 100, a layer of protection layer 900 may be first manufactured on the surface thereof, and then a phase difference film 500 and a polarization functional film 600 may be attached in turn to the protection layer 900. That is, as shown in FIG. 2b and FIG. 2c, the above organic electroluminescent device according to the embodiment of the invention may further include: a protection layer 900, which is located between the organic electroluminescent pixel array 200 and the phase difference film 500 and covers the surface of the organic electroluminescent pixel array 200.

Specifically, the protection layer 900 may employ the same material as the packaging film 300, generally, an inorganic compound such as $Al_2O_3$, $TiO_2$, $SiN_X$ or SiC, etc.

In the above organic electroluminescent display according to the embodiment of the invention, before finally packaging an organic electroluminescent pixel array, a phase difference film and a polarization functional film in the circular sheet polarizer are in turn attached to the organic electroluminescent pixel array, and the unnecessary films, such as a TAC film with a certain mechanical strength and a binding agent layer, etc., that need to be attached to the two sides of a polarization functional film in an existing circular sheet polarizer may be omitted, then the organic electroluminescent pixel array attached with the phase difference film and the polarization functional film is packaged. Thus, the transmittance of the display may be improved, and the contrast of a display can be increased; moreover, the overall thickness of the organic electroluminescent display may be further reduced, so that the organic electroluminescent display may be lighter and thinner, and the problem of being difficult to roll up may be avoided. In addition, because the phase difference film and the polarization functional film is attached in a vacuum, or in a condition protected by inert gas or nitrogen gas, there exists no interference of aqueous vapor and oxygen, thus the durability of the circular sheet polarizer can be increased.

Figure 3:
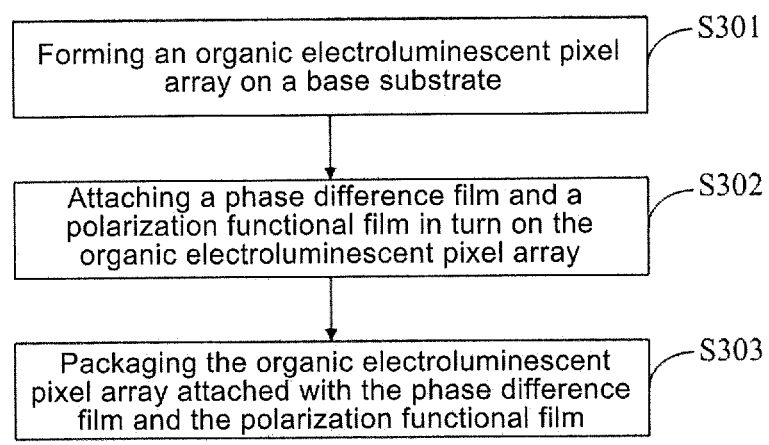
FIG. 3 is a flow chart of a method for preparing an organic electroluminescent display according to one embodiment of the invention.

Based on the same inventive concept, one embodiment of the invention there further provides a method for preparing the above organic electroluminescent display. As shown in FIG. 3, the preparation method includes the following steps performed in a vacuum, or in an environment protected by inert gas or nitrogen gas:

S301: forming an organic electroluminescent pixel array on a base substrate;

S302: attaching a phase difference film and a polarization functional film in turn on the organic electroluminescent pixel array; and S303: packaging the organic electroluminescent pixel array attached with the phase difference film and the polarization functional film, for example, via film packaging or coverplate packaging.

In one embodiment of the invention, the above step S302 is performed in a glove box under nitrogen gas atmosphere.

Figure 4:
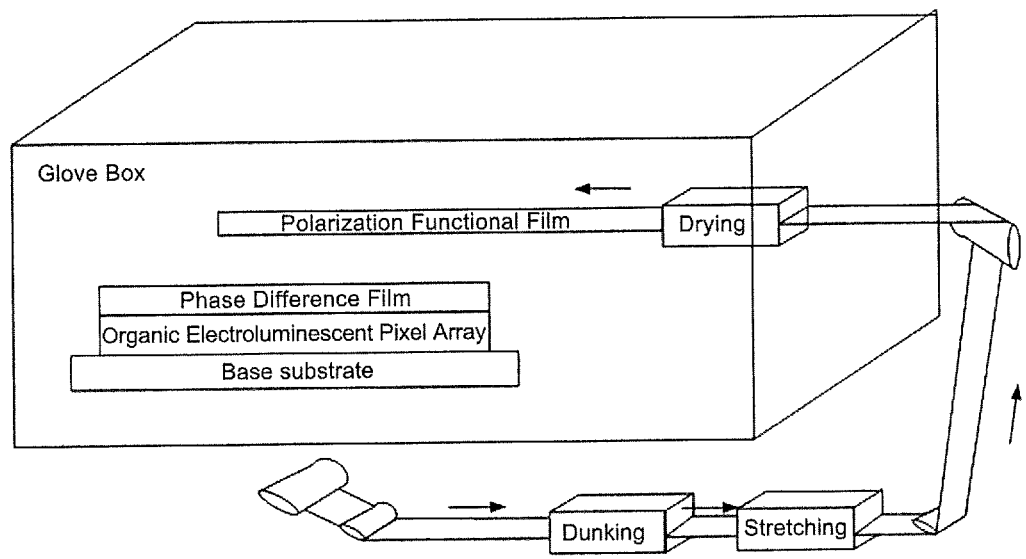
FIG. 4 is a schematic diagram showing the specific preparation of an organic electroluminescent display according to one embodiment of the invention.

In one embodiment of the invention, during the step of attaching a polarization functional film in the above step S302, as shown in FIG. 4, a dunking process and a stretching process, etc., may be performed on the polarization functional film outside the glove box. Then after the polarization functional film is dried inside the glove box, it is attached in roll mode to an organic electroluminescent pixel array attached with a phase difference film.

Figure 5:
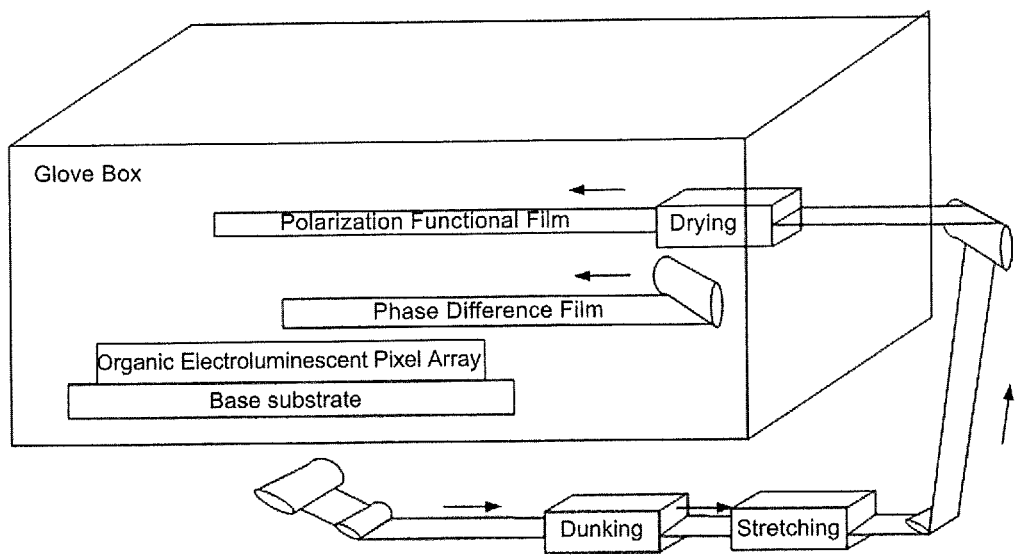
FIG. 5 is a schematic diagram showing the specific preparation of an organic electroluminescent display according to one embodiment of the invention.

In one embodiment of the invention, during the step of attaching a phase difference film in the above step S302, as shown in FIG. 5, the phase difference film may also be attached in roll mode to an organic electroluminescent pixel array inside the glove box.

In one embodiment of the invention, when the above organic electroluminescent display is applied to a flexible device, the above step S301 of forming an organic electroluminescent pixel array on a base substrate and the above step S302 of attaching a phase difference film and a polarization functional film in turn on the organic electroluminescent pixel array may be both realized in Roll to Roll mode, thus the production efficiency may be improved, and the cost may be saved.

However, during specific implementation, it is not limited to the above roll mode and the above Roll to Roll mode; instead, Sheet to Sheet mode may be employed, or other modes that can realize the solution of the invention may be employed, which will not be limited here.

Based on the same inventive concept, one embodiment of the invention further provides a display device, which includes the above organic electroluminescent display according to the embodiment of the invention. Since the principle of the display device is similar to that of the previous organic electroluminescent display, reference may be made to the implementation of the organic electroluminescent display for the implementation of the display device, and no repeated description will be given here.

According to the embodiments of the invention, there provide an organic electroluminescent display and a method for preparing the same, and a display device. Before finally packaging an organic electroluminescent pixel array, a phase difference film and a polarization functional film in a circular sheet polarizer are attach in turn to the organic electroluminescent pixel array, and the unnecessary films, such as a TAC film with a certain mechanical strength and a binding agent layer, etc., that need to be attached on the two sides of a polarization functional film in an existing circular sheet polarizer may be omitted, and then the organic electroluminescent pixel array attached with the phase difference film and the polarization functional film is packaged. Thus, the transmittance of the display may be improved, and the contrast of a display can be increased; moreover, the overall thickness of the organic electroluminescent display may be further reduced, so that the organic electroluminescent display may be lighter and thinner, and the problem of being difficult to roll up may be avoided. In addition, since the phase difference film and the polarization functional film are attached in a vacuum, or under a condition protected by inert gas or nitrogen gas, there exists no interference of aqueous vapor and oxygen, thus the durability of the circular sheet polarizer can be increased.

Apparently, various modifications and variations may be made by one skilled in the art without departing from the spirit and scope of the invention. Thus, if these modifications and variations pertain to the scope of the claims of the invention and theirs equivalents, the invention intends to encompass such modifications and variations.

What is claimed is:

1. An organic electroluminescent display, comprising:
   a base substrate;
   an organic electroluminescent pixel array on the base substrate;
   a phase difference film on a side of the organic electroluminescent pixel array distal to the base substrate;
   a polarization functional film on a side of the phase difference film distal to the organic electroluminescent pixel array and being in physical contact with the phase difference film; and
   a packaging structure on a side of the polarization functional film distal to the phase difference film and being configured to package the organic electroluminescent pixel array, the phase difference film and the polarization functional film;
   wherein the organic electroluminescent pixel array, the phase difference film and the polarization functional film are inside a sealed structure made of the packaging structure and the base substrate.

2. The organic electroluminescent display according to claim 1, wherein the packaging structure comprises a packaging film, and the packaging film substantially covers the organic electroluminescent pixel array, the phase difference film and the polarization functional film and being in physical contact with the base substrate.

3. The organic electroluminescent display according to claim 1, wherein the packaging structure comprises a packaging coverplate and a sealant,
   the packaging coverplate is on a side of the polarization functional film distal to the phase difference film; and
   the sealant surrounds the organic electroluminescent pixel array, the phase difference film and the polarization functional film and is located between the packaging coverplate and the base substrate.

4. The organic electroluminescent display according to claim 1, further comprising: a protection layer between the organic electroluminescent pixel array and the phase difference film and on a surface of the organic electroluminescent pixel array.

5. The organic electroluminescent display according to claim 1, further comprising: a filling layer between the polarization functional film and the packaging structure for isolating water and oxygen, supporting a cell thickness and coping with a change in an external stress.

6. The organic electroluminescent display according to claim 1, wherein the phase difference film is a quarter-wavelength phase difference film.

7. The organic electroluminescent display according to claim 6, wherein a material of the phase difference film is a mixture of polyvinyl chloride and polymethyl methacrylate, a mixture of polystyrene and polypropylene, or a mixture of polycarbonate resins.

8. The organic electroluminescent display according to claim 1, wherein a thickness of the phase difference film is in a range of 100 nm to 100 µm.

9. The organic electroluminescent display according to claim 1, wherein a material of polarization functional film is polyvinyl alcohol or carbon nano-tube.

10. A display device, comprising the organic electroluminescent display according to claim 1.

* * * * *